(12) United States Patent
Han

(10) Patent No.: US 10,037,732 B2
(45) Date of Patent: Jul. 31, 2018

(54) AMOLED PIXEL DRIVING CIRCUIT AND PIXEL DRIVING METHOD

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 278 days.

(21) Appl. No.: 15/105,569

(22) PCT Filed: Apr. 25, 2016

(86) PCT No.: PCT/CN2016/080103
§ 371 (c)(1),
(2) Date: Jun. 17, 2016

(87) PCT Pub. No.: WO2017/156826
PCT Pub. Date: Sep. 21, 2017

(65) Prior Publication Data
US 2018/0102095 A1  Apr. 12, 2018

(30) Foreign Application Priority Data

Mar. 17, 2016 (CN) .......................... 2016 1 0154557

(51) Int. Cl.
 G09G 3/3266 (2016.01)
 H01L 27/32 (2006.01)
(52) U.S. Cl.
 CPC ....... G09G 3/3266 (2013.01); H01L 27/3262 (2013.01); H01L 27/3265 (2013.01)
(58) Field of Classification Search
 CPC combination set(s) only.
 See application file for complete search history.

Primary Examiner — Robin Mishler
(74) Attorney, Agent, or Firm — Leong C. Lei

(57) ABSTRACT

The present invention provides an AMOLED pixel driving circuit and a pixel driving method. The AMOLED pixel driving circuit utilizes a 5T1C structure driving circuit, comprising a first thin film transistor (T1), a second thin film transistor (T2), a third thin film transistor (T3), a fourth thin film transistor (T4), a fifth thin film transistor (T5), a capacitor (C1) and an organic light emitting diode (D1), and the nth scan signal (Scan(n)), the n-1th scan signal (Scan (n-1)) and the light emitting control signal (Em(n)) are combined with one another, and correspond to an OLED activation voltage extracting stage, a program stage and a light emitting stage one after another. Ultimately, the current $I_{OLED}$ flowing through the organic light emitting diode (D1) satisfies: $I_{OLED} \propto (V_{Data}-Vref+VSS+V_{OLED}-VDD-V_{th1})^2$. The $I_{OLED}$ which increases along with the $V_{OLED}$ can qualitatively compensate the brightness decay of the organic light emitting diode.

14 Claims, 11 Drawing Sheets

AMOLED PIXEL DRIVING CIRCUIT AND PIXEL DRIVING METHOD

FIELD OF THE INVENTION

The present invention relates to a display technology field, and more particularly to an AMOLED pixel driving circuit and a pixel driving method.

BACKGROUND OF THE INVENTION

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

The AMOLED is a current driving element. When the electrical current flows through the organic light emitting diode, the organic light emitting diode emits light, and the brightness is determined according to the current flowing through the organic light emitting diode itself. Most of the present Integrated Circuits (IC) only transmit voltage signals. Therefore, the AMOLED pixel driving circuit needs to accomplish the task of converting the voltage signals into the current signals. The traditional AMOLED pixel driving circuit generally is 2T1C, which is a structure comprising two thin film transistors and one capacitor to convert the voltage into the current.

As shown in FIG. 1, which is a 2T1C pixel driving circuit employed for AMOLED, comprising a first thin film transistor T10, a second thin film transistor T20 and a capacitor C10. The first thin film transistor T10 is a switch thin film transistor, and the second thin film transistor T20 is a drive thin film transistor, and the capacitor C10 is a storage capacitor. Specifically, a gate of the first thin film transistor T10 receives a scan signal Scan(n) corresponded with a row where the pixel driving circuit is, and a source receives a data signal Data, and a drain is electrically coupled to the gate of the second thin film transistor T20 and one end of the capacitor C10; a source of the second thin film transistor T20 is electrically coupled to a power source positive voltage VDD, and a drain is electrically coupled to an anode of the organic light emitting diode D10; a cathode of the organic light emitting diode D10 is electrically coupled to a power source negative voltage VSS; the one end of the capacitor C10 is electrically coupled to the drain of the first thin film transistor T10, and the other end is electrically coupled to the source of the second thin film transistor T20. As the AMOLED displays, the scan signal Scan(n) controls the first thin film transistor T10 to be activated, and the data signal Data enters the gate of the second thin film transistor T20 and the capacitor C10 via the first thin film transistor T10. Then, the first thin film transistor T10 is deactivated. With the storage function of the capacitor C10, the gate voltage of the second thin film transistor T20 can remain to hold the data signal voltage to make the second thin film transistor T20 to be in the conducted state to drive the current to enter the organic light emitting diode D10 via the second thin film transistor T20 and to drive the organic light emitting diode D10 to emit light.

The structure of the pixel driving circuit shown in FIG. 1 is simpler and does not have the compensation function, and thus many defects exist. The more obvious one is: the deterioration of device will happen after the longterm work of the organic light emitting diode D10, and the light emitting efficiency reduces, and the brightness decays, which results in that the entire panel of the OLED display device biases darker and influences the display quality of the OLED display device.

SUMMARY OF THE INVENTION

An objective of the present invention is to provide an AMOLED pixel driving circuit, which can compensate the light emitting efficiency reduction and the brightness decay condition after longterm work of the organic light emitting diode to raise the display quality of the OLED display device.

Another objective of the present invention is to provide an AMOLED pixel driving method, which can compensate the light emitting efficiency reduction and the brightness decay condition after longterm work of the organic light emitting diode to raise the display quality of the OLED display device.

For realizing the aforesaid objectives, the present invention first provides an AMOLED pixel driving circuit, comprising: a first thin film transistor, a second thin film transistor, a third thin film transistor, a fourth thin film transistor, a fifth thin film transistor, a capacitor and an organic light emitting diode;

a gate of the second thin film transistor receives a nth scan signal corresponded with a row where the pixel driving circuit is, and a source receives a data signal, and a drain is electrically coupled to a first node;

a gate of the fourth thin film transistor receives a n-1th scan signal corresponded with a previous row of the row where the pixel driving circuit is, and a source receives a reference voltage, and a drain is electrically coupled to the first node;

one end of the capacitor is electrically coupled to the first node, and the other end is electrically coupled to a gate of the first thin film transistor;

a gate of the third thin film transistor receives the n-1th scan signal, and a source is electrically coupled to the gate of the first thin film transistor, and a drain is electrically coupled to an anode of the organic light emitting diode;

the gate of the first thin film transistor is electrically coupled to the other end of the capacitor, and a source receives a power source positive voltage, and a drain is electrically coupled to a source of the fifth thin film transistor;

a gate of the fifth thin film transistor receives a light emitting control signal, and a source is electrically coupled to the drain of the first thin film transistor, and a drain is electrically coupled to the anode of the organic light emitting diode;

the anode of the organic light emitting diode is electrically coupled to the drain of the fifth thin film transistor and the drain of the third thin film transistor, and a cathode receives a power source negative voltage.

All of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

The reference voltage is a constant voltage.

The nth scan signal corresponded with the row where the pixel driving circuit is, the n-1th scan signal corresponded with a previous row of the row where the pixel driving circuit is and the light emitting control signal are combined with one another, and correspond to an OLED activation voltage extracting stage, a program stage and a light emitting stage one after another.

Selectably, all of the first thin film transistor, the second thin film transistor, the third thin film transistor, the fourth thin film transistor and the fifth thin film transistor are P type third thin film transistors;

in the OLED activation voltage extracting stage, the n-1th scan signal is low voltage level, and the nth scan signal is high voltage level, and the light emitting control signal is high voltage level;

in the program stage, the n-1th scan signal is high voltage level, and the nth scan signal is low voltage level, and the light emitting control signal is high voltage level;

in the light emitting stage, the n-1th scan signal is high voltage level, and the nth scan signal is high voltage level, and the light emitting control signal is low voltage level.

Selectably, all of the first thin film transistor, the second thin film transistor, the third thin film transistor, the fourth thin film transistor and the fifth thin film transistor are N type third thin film transistors;

in the OLED activation voltage extracting stage, the n-1th scan signal is high voltage level, and the nth scan signal is low voltage level, and the light emitting control signal is low voltage level;

in the program stage, the n-1th scan signal is high voltage level, and the nth scan signal is high voltage level, and the light emitting control signal is low voltage level;

in the light emitting stage, the n-1th scan signal is low voltage level, and the nth scan signal is low voltage level, and the light emitting control signal is high voltage level.

The present invention further provides an AMOLED pixel driving method, comprising steps of:

step 1, providing an AMOLED pixel driving circuit;

the AMOLED pixel driving circuit comprises: a first thin film transistor, a second thin film transistor, a third thin film transistor, a fourth thin film transistor, a fifth thin film transistor, a capacitor and an organic light emitting diode;

a gate of the second thin film transistor receives a nth scan signal corresponded with a row where the pixel driving circuit is, and a source receives a data signal, and a drain is electrically coupled to a first node;

a gate of the fourth thin film transistor receives a n-1th scan signal corresponded with a previous row of the row where the pixel driving circuit is, and a source receives a reference voltage, and a drain is electrically coupled to the first node;

one end of the capacitor is electrically coupled to the first node, and the other end is electrically coupled to a gate of the first thin film transistor;

a gate of the third thin film transistor receives the n-1th scan signal, and a source is electrically coupled to the gate of the first thin film transistor, and a drain is electrically coupled to an anode of the organic light emitting diode;

the gate of the first thin film transistor is electrically coupled to the other end of the capacitor, and a source receives a power source positive voltage, and a drain is electrically coupled to a source of the fifth thin film transistor;

a gate of the fifth thin film transistor receives a light emitting control signal, and a source is electrically coupled to the drain of the first thin film transistor, and a drain is electrically coupled to the anode of the organic light emitting diode;

the anode of the organic light emitting diode is electrically coupled to the drain of the fifth thin film transistor and the drain of the third thin film transistor, and a cathode receives a power source negative voltage.

step 2, entering an OLED activation voltage extracting stage;

the n-1th scan signal provides a effective potential to activate the fourth thin film transistor and the third thin film transistor, and both the nth scan signal and the light emitting control signal provide non effective potentials to deactivate the second thin film transistor and the fifth thin film transistor; the first node is written with the reference voltage, and a voltage level Vg of the gate of the first thin film transistor is discharged to:

$$Vg=VSS+V_{OLED}$$

VSS represents a power source negative voltage, and $V_{OLED}$ represent an activation voltage of the organic light emitting diode;

step 3, entering a program stage;

the nth scan signal provides the effective potential to activate the second thin film transistor, and both the n-1th scan signal and the light emitting control signal provide non effective potentials to deactivate the third thin film transistor, the fourth thin film transistor and the fifth thin film transistor; the first node is written with a voltage $V_{Data}$ of the data signal, and with the capacitor, the voltage level Vg of the gate of the first thin film transistor is coupled to:

$$Vg=V_{Data}-Vref+VSS+V_{OLED}$$

step 4, entering a light emitting stage;

both the n-1th scan signal and the nth scan signal provide non effective potentials to deactivate the second thin film transistor, the third thin film transistor and the fourth thin film transistor, and the light emitting control signal provides the effective potential to activate the fifth thin film transistor, and the first thin film transistor is also activated, and the organic light emitting diode emits light, and a current $I_{OLED}$ flowing through the organic light emitting diode satisfies:

$$I_{OLED} \propto (V_{DATA}-Vref+VSS+V_{OLED}-VDD-V_{th1})^2$$

VDD represents a power source positive voltage, and $V_{th1}$ represents a threshold voltage of the first thin film transistor.

Selectably, all of the first thin film transistor, the second thin film transistor, the third thin film transistor, the fourth thin film transistor and the fifth thin film transistor are P type thin film transistors; the effective potential is low voltage level, and the non effective potential is high voltage level.

Selectably, all of the first thin film transistor, the second thin film transistor, the third thin film transistor, the fourth thin film transistor and the fifth thin film transistor are N type thin film transistors; the effective potential is high voltage level, and the non effective potential is low voltage level.

The reference voltage is a constant voltage.

The present invention further provides an AMOLED pixel driving circuit, comprising: a first thin film transistor, a third thin film transistor, a fourth thin film transistor, a fifth thin film transistor, a capacitor and an organic light emitting diode;

a gate of the second thin film transistor receives a nth scan signal corresponded with a row where the pixel driving circuit is, and a source receives a data signal, and a drain is electrically coupled to a first node;

a gate of the fourth thin film transistor receives a n-1th scan signal corresponded with a previous row of the row where the pixel driving circuit is, and a source receives a reference voltage, and a drain is electrically coupled to the first node;

one end of the capacitor is electrically coupled to the first node, and the other end is electrically coupled to a gate of the first thin film transistor;

a gate of the third thin film transistor receives the n-1th scan signal, and a source is electrically coupled to the gate of the first thin film transistor, and a drain is electrically coupled to an anode of the organic light emitting diode;

the gate of the first thin film transistor is electrically coupled to the other end of the capacitor, and a source receives a power source positive voltage, and a drain is electrically coupled to a source of the fifth thin film transistor;

a gate of the fifth thin film transistor receives a light emitting control signal, and a source is electrically coupled to the drain of the first thin film transistor, and a drain is electrically coupled to the anode of the organic light emitting diode;

the anode of the organic light emitting diode is electrically coupled to the drain of the fifth thin film transistor and the drain of the third thin film transistor, and a cathode receives a power source negative voltage;

wherein all of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors;

wherein the reference voltage is a constant voltage.

The benefits of the present invention are: the present invention provides a AMOLED pixel driving circuit and a pixel driving method, and the invention utilizes a 5T1C structure driving circuit, and the nth scan signal, the n-1th scan signal and the light emitting control signal are combined with one another, and correspond to an OLED activation voltage extracting stage, a program stage and a light emitting stage one after another. Ultimately, the current $I_{OLED}$ flowing through the organic light emitting diode satisfies: $I_{OLED} \propto (V_{Data}-Vref+VSS+V_{OLED}-VDD-V_{th1})^2$. The activation voltage $V_{OLED}$ raises due to the degradation after longterm work of the organic light emitting diode, and the $I_{OLED}$ which increases accordingly can qualitatively compensate the brightness decay of the organic light emitting diode, which can compensate the light emitting efficiency reduction and the brightness decay condition after longterm work of the organic light emitting diode to raise the display quality of the OLED display device.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
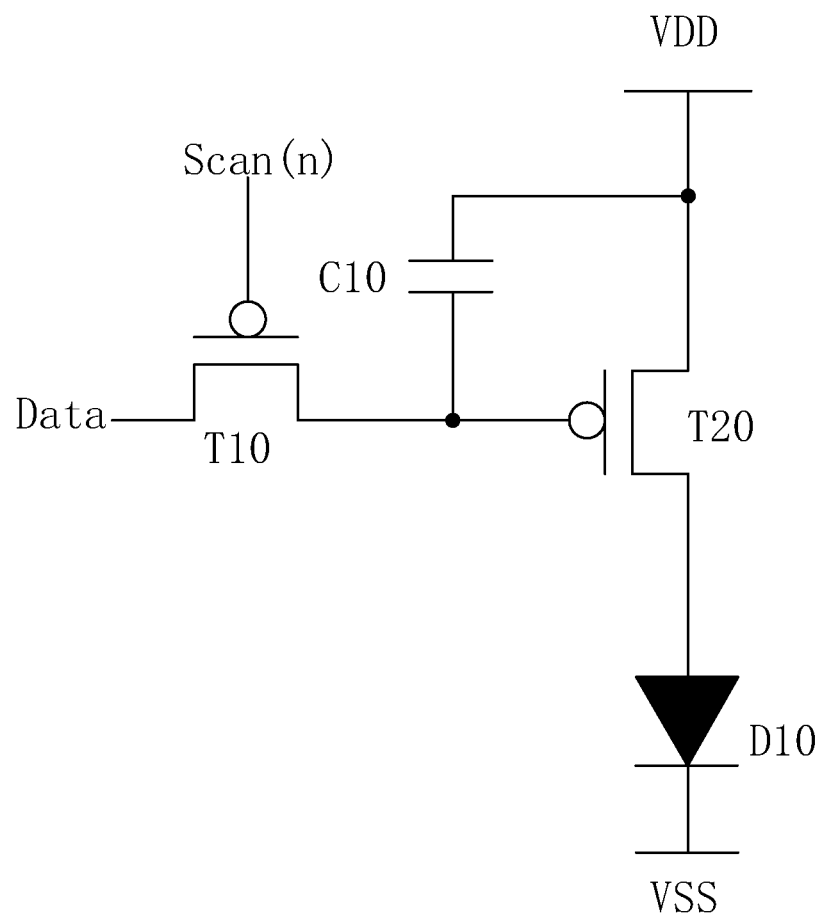
FIG. 1 is a circuit diagram of 2T1C pixel driving circuit employed for AMOLED according to prior art.
Figure 2:
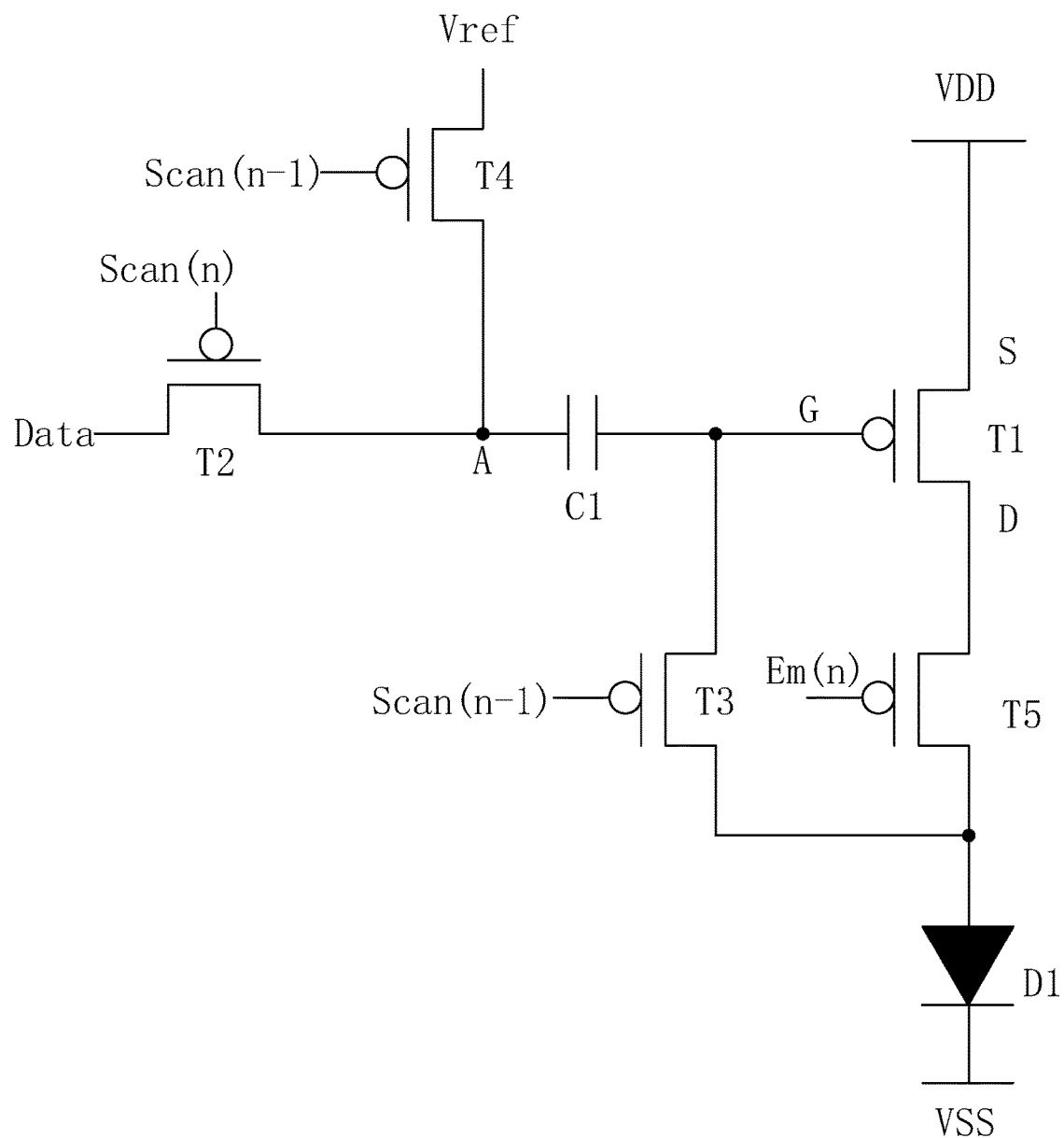
FIG. 2 is a circuit diagram of an AMOLED pixel driving circuit according to the first embodiment of the present invention.
Figure 7:
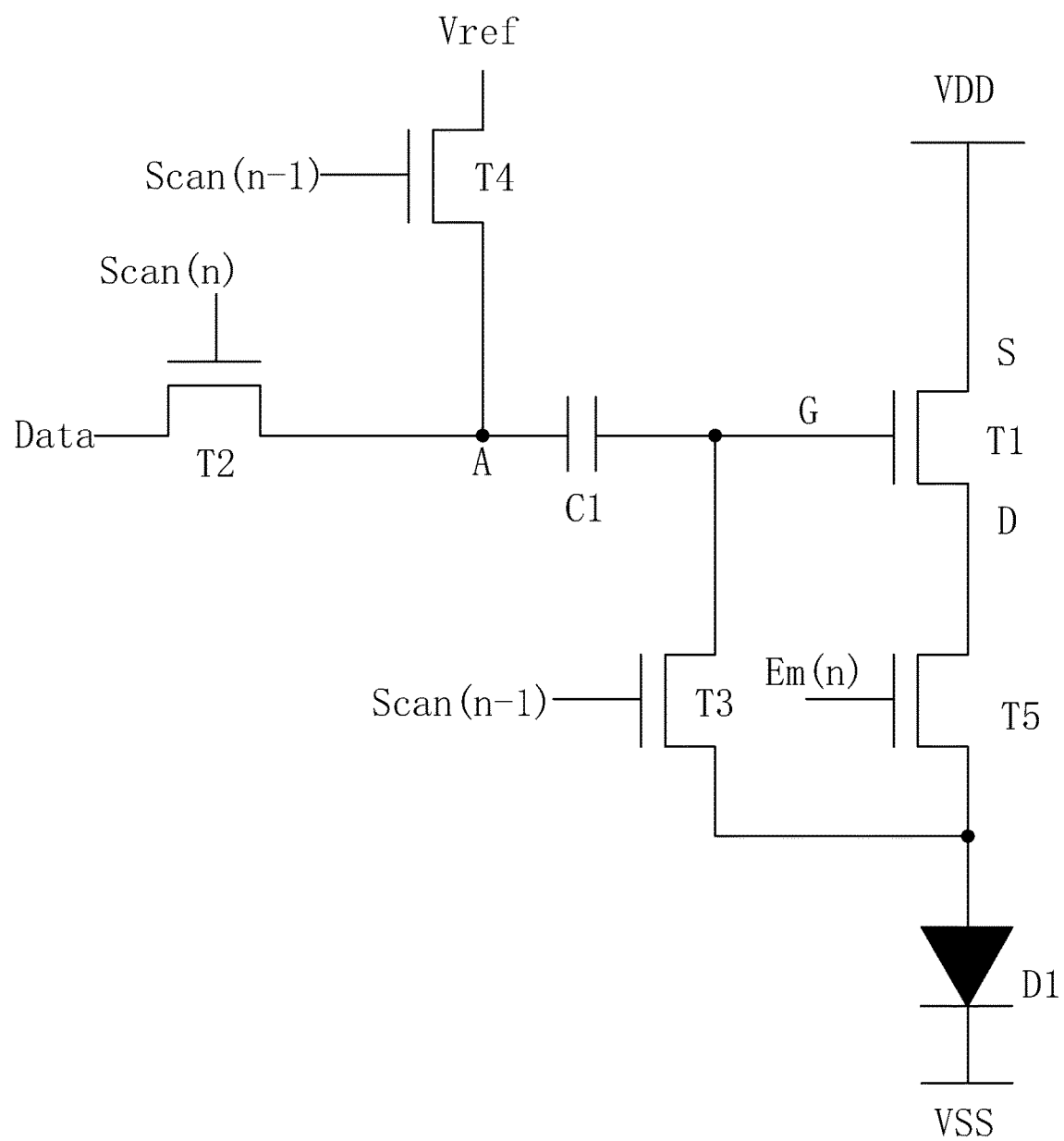
FIG. 7 is a circuit diagram of an AMOLED pixel driving circuit according to the second embodiment of the present invention.

Please refer to FIG. 2 or FIG. 7. The present invention first provides an AMOLED pixel driving circuit, and the AMOLED pixel driving circuit utilizes a 5T1C structure, and comprises: a first thin film transistor T1, a second thin film transistor T2, a third thin film transistor T3, a fourth thin film transistor T4, a fifth thin film transistor T5, a capacitor C1 and an organic light emitting diode D1.

A gate of the second thin film transistor T2 receives a nth scan signal Scan(n) corresponded with a row where the pixel driving circuit is, and a source receives a data signal Data, and a drain is electrically coupled to a first node A; a gate of the fourth thin film transistor T4 receives a n-1th scan signal Scan(n-1) corresponded with a previous row of the row where the pixel driving circuit is, and a source receives a reference voltage Vref, and a drain is electrically coupled to the first node A; one end of the capacitor C1 is electrically coupled to the first node A, and the other end is electrically coupled to a gate of the first thin film transistor T1; a gate of the third thin film transistor T3 receives the n-1th scan signal Scan(n-1), and a source is electrically coupled to the gate G of the first thin film transistor T1, and a drain is electrically coupled to an anode of the organic light emitting diode D1; the gate G of the first thin film transistor T1 is electrically coupled to the other end of the capacitor C1, and a source S receives a power source positive voltage VDD, and a drain D is electrically coupled to a source of the fifth thin film transistor T5; a gate of the fifth thin film transistor T5 receives a light emitting control signal Em(n), and a source is electrically coupled to the drain D of the first thin film transistor T1, and a drain is electrically coupled to the anode of the organic light emitting diode D1; the anode of the organic light emitting diode D1 is electrically coupled to the drain of the fifth thin film transistor T5 and the drain of the third thin film transistor T3, and a cathode receives a power source negative voltage VSS.

The nth scan signal Scan(n) corresponded with a row where the pixel driving circuit is is employed to control on and off of the second thin film transistor T2, and the n-1th scan signal Scan(n-1) corresponded with a previous row of the row where the pixel driving circuit is is employed to control on and off of the fourth thin film transistor T4 and the third thin film transistor T3, and the light emitting control signal Em(n) is employed to control on and off of the fifth thin film transistor T5. The first thin film transistor T1 is a drive thin film transistor. The reference voltage Vref is a constant voltage.

Specifically, all of the first thin film transistor T1, the second thin film transistor T2, the third thin film transistor T3, the fourth thin film transistor T4 and the fifth thin film transistor T5 are Low Temperature Poly-silicon thin film transistors, oxide semiconductor thin film transistors or amorphous silicon thin film transistors.

Figure 3:
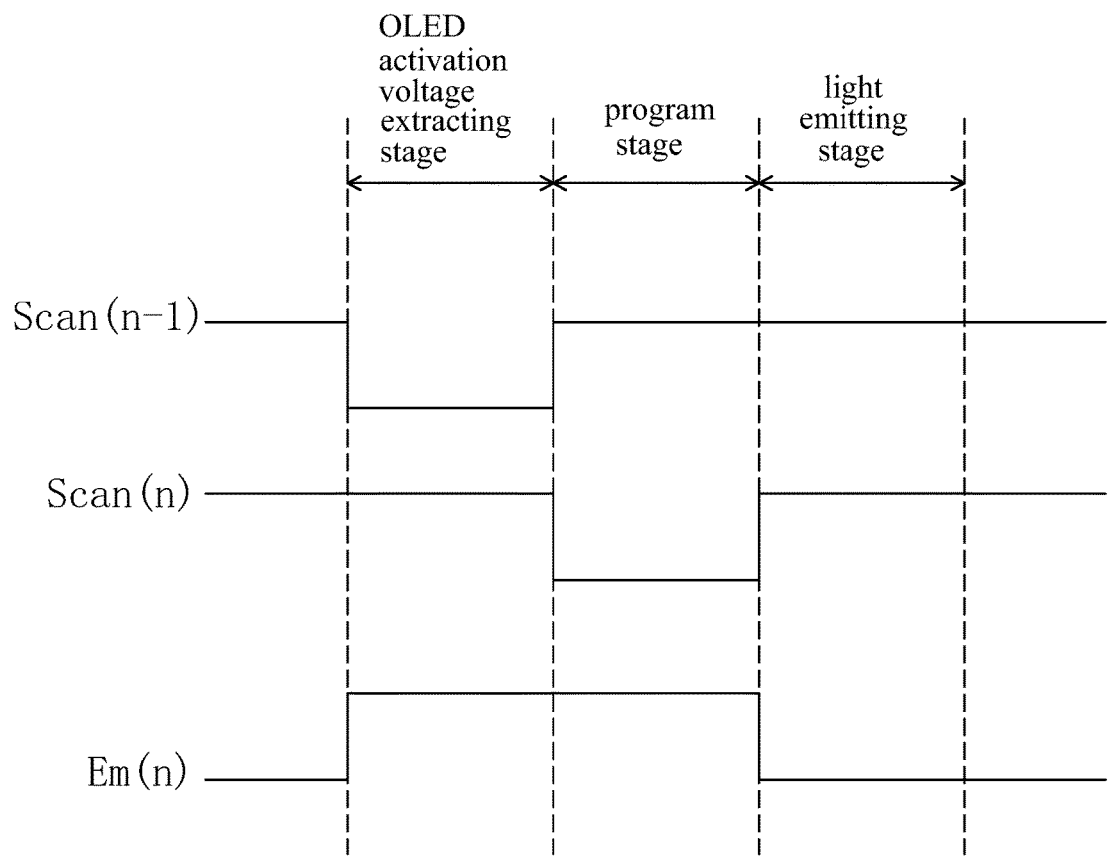
FIG. 3 is a sequence diagram of the AMOLED pixel driving circuit shown in FIG. 2.
Figure 8:
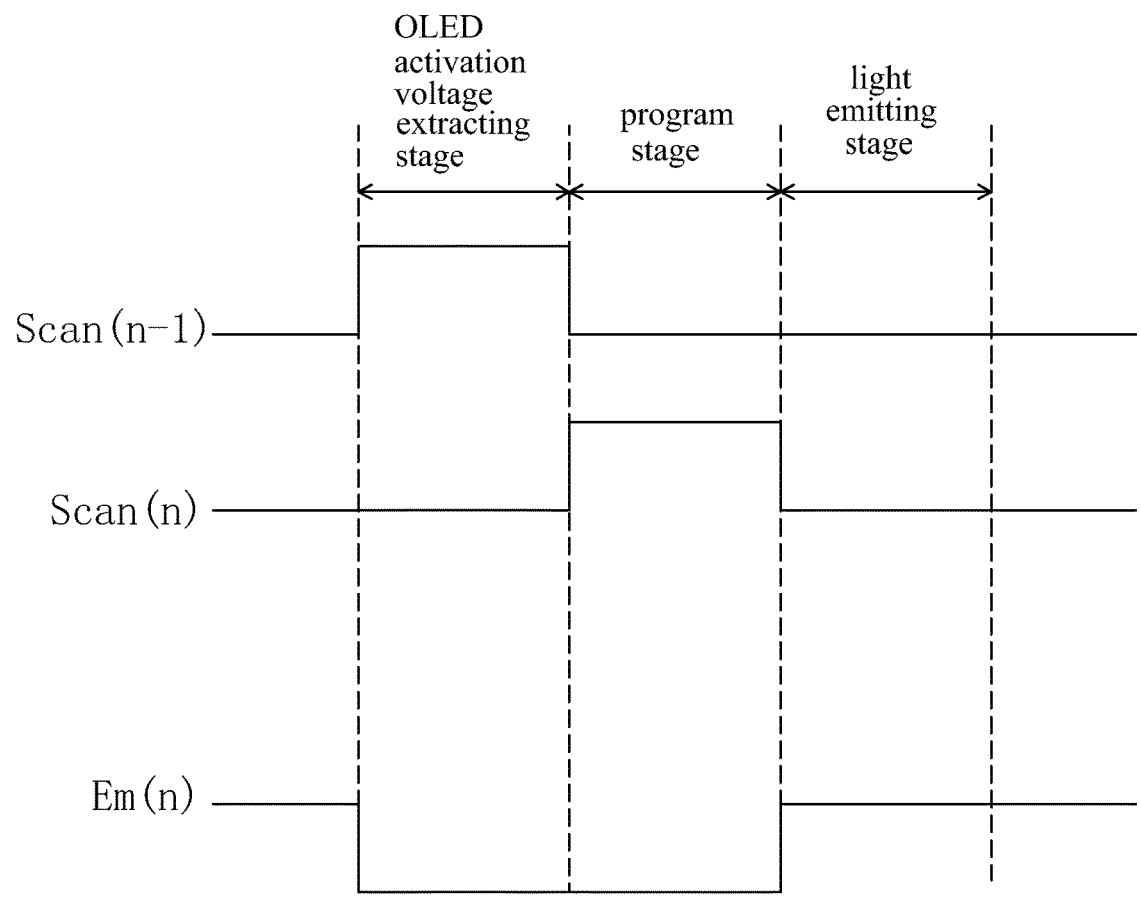
FIG. 8 is a sequence diagram of the AMOLED pixel driving circuit shown in FIG. 7.

Please refer to FIG. 3 or FIG. 8. The nth scan signal Scan(n) corresponded with the row where the pixel driving circuit is, the n-1th scan signal Scan(n-1) corresponded with a previous row of the row where the pixel driving circuit is and the light emitting control signal Em(n) are combined with one another, and correspond to an OLED activation voltage extracting stage, a program stage and a light emitting stage one after another.

FIG. 2 and FIG. 3 shows the first embodiment of the AMOLED pixel driving circuit according to the present invention. In the first embodiment, all of the first thin film transistor T1, the second thin film transistor T2, the third thin film transistor T3, the fourth thin film transistor T4 and the fifth thin film transistor T5 are P type third thin film transistors.

In the OLED activation voltage extracting stage, the n-1th scan signal Scan(n-1) is low voltage level, and the nth scan signal Scan(n) is high voltage level, and the light emitting control signal Em(n) is high voltage level. Both the fourth thin film transistor T4 and the third thin film transistor T3 are activated, and both the second thin film transistor T2 and the fifth thin film transistor T5 are deactivated, and the first node A is written with the reference voltage Vref, and through the activated third thin film transistor T3, a voltage level Vg of the gate G of the first thin film transistor T1 is discharged to:

$$Vg = VSS + V_{OLED} \quad (1)$$

VSS represents a power source negative voltage, and $V_{OLED}$ represent an activation voltage of the organic light emitting diode D1.

in the program stage, the n-1th scan signal Scan(n-1) is high voltage level, and the nth scan signal Scan(n) is low voltage level, and the light emitting control signal Em(n) is high voltage level. All the second thin film transistor T2, the third thin film transistor T3, the fourth thin film transistor T4 and the fifth thin film transistor T5 are deactivated, and the first node A is written with the voltage $V_{Data}$ of the data signal Data, and with the capacitor C1, the voltage level Vg of the gate G of the first thin film transistor T1 is coupled to:

$$Vg = V_{DATA} - [Vref - (VSS + V_{OLED})] = V_{DATA} - Vref + VSS + V_{OLED} \quad (2)$$

In the light emitting stage, the n-1th scan signal Scan(n-1) is high voltage level, and the nth scan signal Scan(n) is high voltage level, and the light emitting control signal Em(n) is low voltage level. All the second thin film transistor T2, the third thin film transistor T3 and the fourth thin film transistor T4 are deactivated, and the fifth thin film transistor T5 is activated, and the first thin film transistor T1 is also activated due to the storage function of the capacitor C1, and the organic light emitting diode D1 emits light. Furthermore, as known, the formula of calculating the current $I_{OLED}$ flowing through the organic light emitting diode is:

$$I_{OLED} = \tfrac{1}{2} Cox(\mu W/L)(Vgs - V_{th1})^2 \quad (3)$$

wherein μ is the carrier mobility of the driving thin film transistor, i.e. the first thin film transistor T1, and W and L respectively are the width and the length of the channel of the driving thin film transistor, i.e. the first thin film transistor T1, and Vgs is the voltage between the gate G and the source S of the driving thin film transistor, i.e. the first thin film transistor T1, and Vth1 is the threshold voltage of the driving thin film transistor, i.e. the first thin film transistor T1.

$$Vgs = Vg - Vs = (V_{DATA} - Vref + VSS + V_{OLED}) - VDD \quad (4)$$

wherein Vs represents the voltage of the source S of the first thin film transistor T1.

The equation (4) is substituted into equation (3) to derive that the current $I_{OLED}$ flowing through the organic light emitting diode D1 satisfies:

$$I_{OLED} \propto (V_{DATA} - Vref + VSS + V_{OLED} - VDD - V_{th1})^2 \quad (5)$$

The activation voltage $V_{OLED}$ raises due to the degradation after longterm work of the organic light emitting diode D1, and according to the equation (5), the AMOLED pixel driving circuit of the present invention can make the $I_{OLED}$ increase along with the rising of the $V_{OLED}$, which can qualitatively compensate the brightness decay of the organic light emitting diode D1 to raise the display quality of the OLED display device, and can compensate the light emitting efficiency reduction and the brightness decay condition after longterm work of the organic light emitting diode to raise the display quality of the OLED display device.

FIG. 7 and FIG. 8 shows the first embodiment of the AMOLED pixel driving circuit according to the present invention. The differences of the second embodiment from the first embodiment are: all of the first thin film transistor T1, the second thin film transistor T2, the third thin film transistor T3, the fourth thin film transistor T4 and the fifth thin film transistor T5 are N type third thin film transistors. Correspondingly, the high and low of the voltages of the nth scan signal Scan(n), the n-1th scan signal Scan(n-1) and the light emitting control signal Em(n) in the second embodiment are set to be opposite to those in the first embodiment, and the same working procedure can be realized to achieve the same compensation result. The repeated description is omitted here.

On the basis of the same inventive idea, the present invention further provides a AMOLED pixel driving method, comprising steps of:

step 1, providing an AMOLED pixel driving circuit utilizing the 5T1C structure as shown in the aforesaid FIG. 2 or FIG. 7, and the description of the circuit is not repeated here.

step 2, entering an OLED activation voltage extracting stage.

Figure 4:
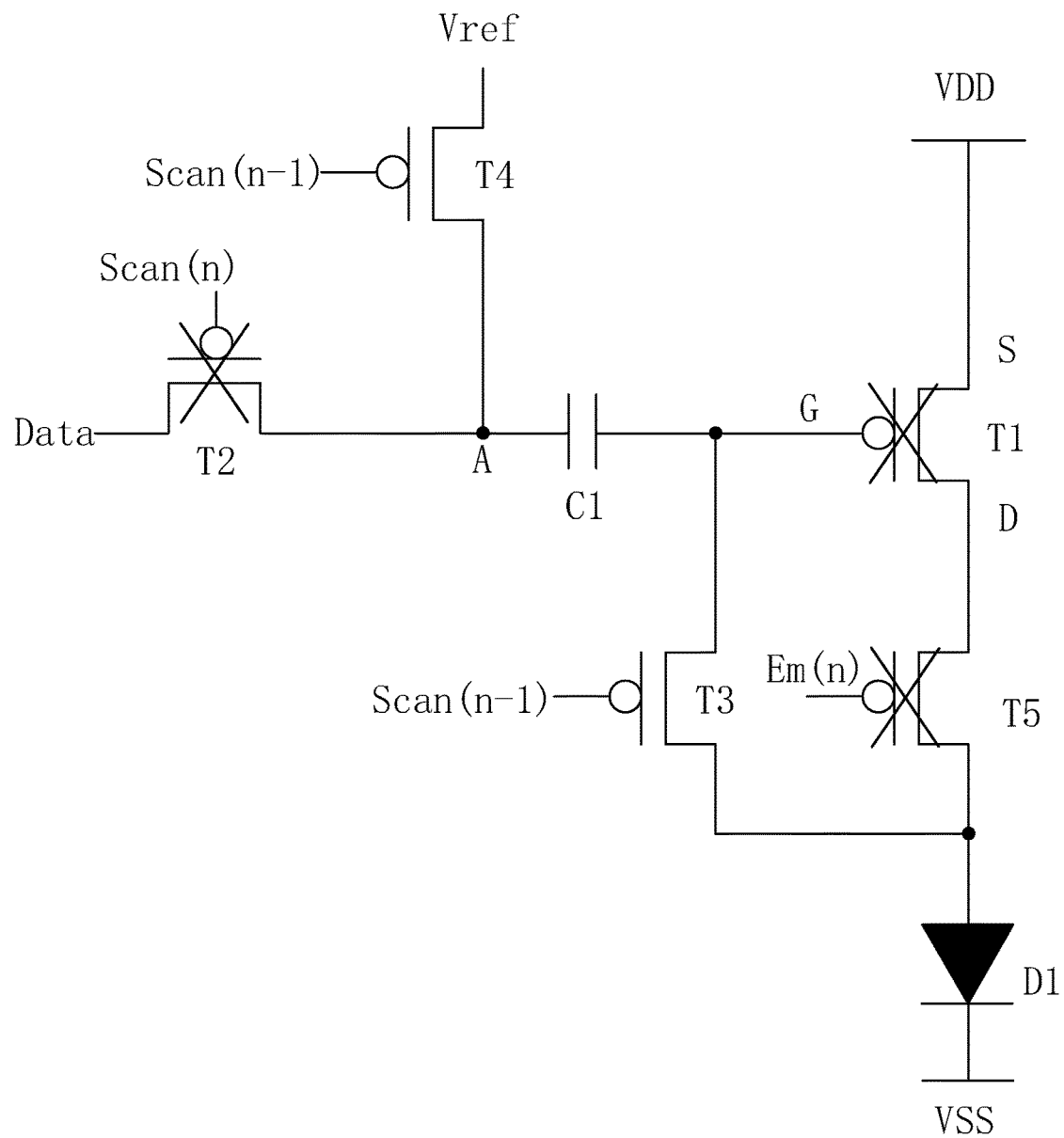
FIG. 4 is a diagram of the step 2 of an AMOLED pixel driving method according to the first embodiment of the present invention.
Figure 9:
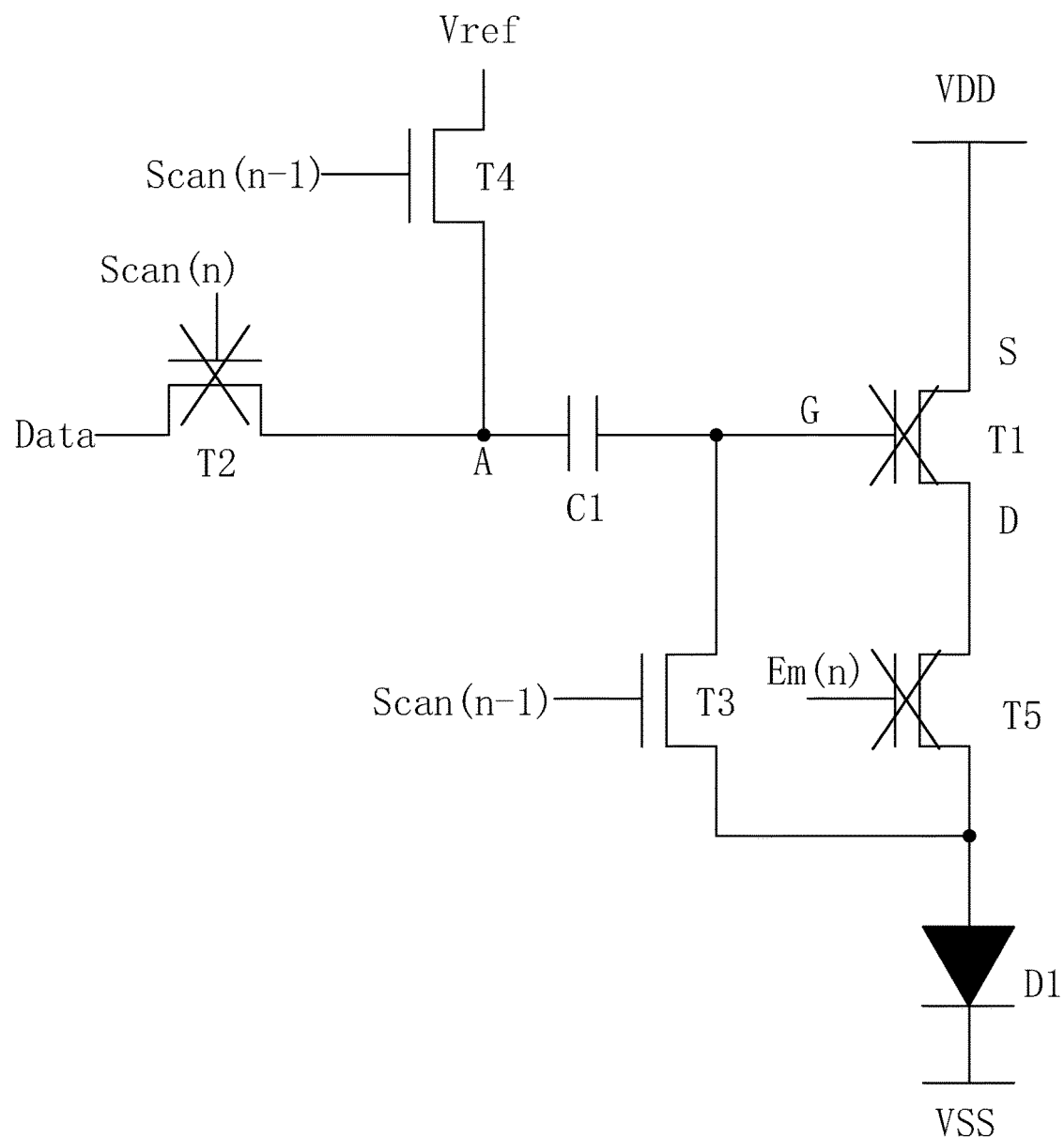
FIG. 9 is a diagram of the step 2 of an AMOLED pixel driving method according to the second embodiment of the present invention.

As shown in FIG. 3 and FIG. 4, or in FIG. 8 and FIG. 9, the n-1th scan signal Scan(n-1) provides a effective potential to activate the fourth thin film transistor T4 and the third thin film transistor T3, and both the nth scan signal Scan(n) and the light emitting control signal Em(n) provide non effective potentials to deactivate the second thin film transistor T2 and the fifth thin film transistor T5; the first node A is written with the reference voltage Vref, and through the activated third thin film transistor T3, a voltage level Vg of the gate G of the first thin film transistor T1 is discharged to:

$$Vg=VSS+V_{OLED} \quad (1)$$

VSS represents a power source negative voltage, and $V_{OLED}$ represent an activation voltage of the organic light emitting diode D1.

Figure 5:
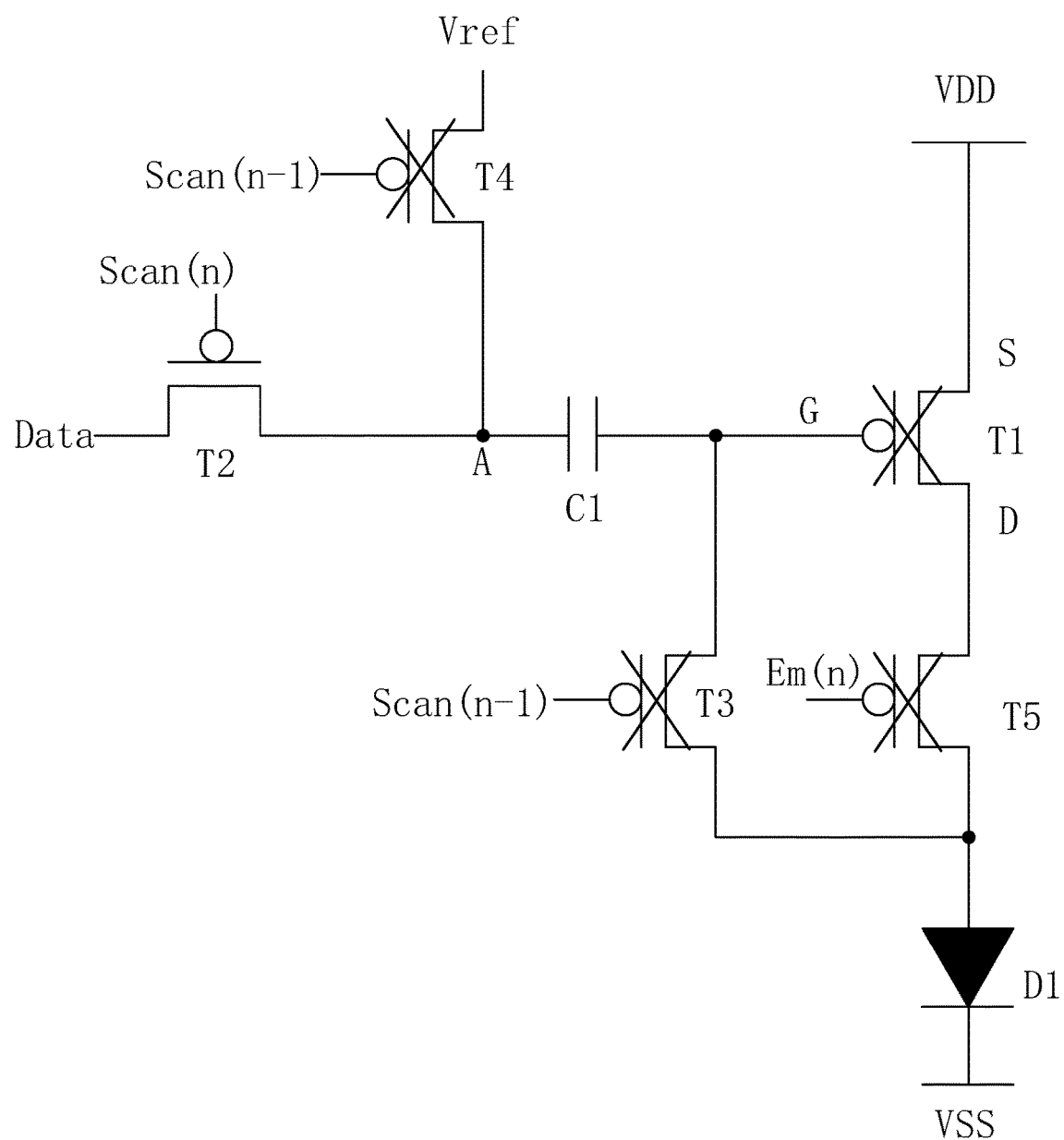
FIG. 5 is a diagram of the step 3 of an AMOLED pixel driving method according to the first embodiment of the present invention.
Figure 10:
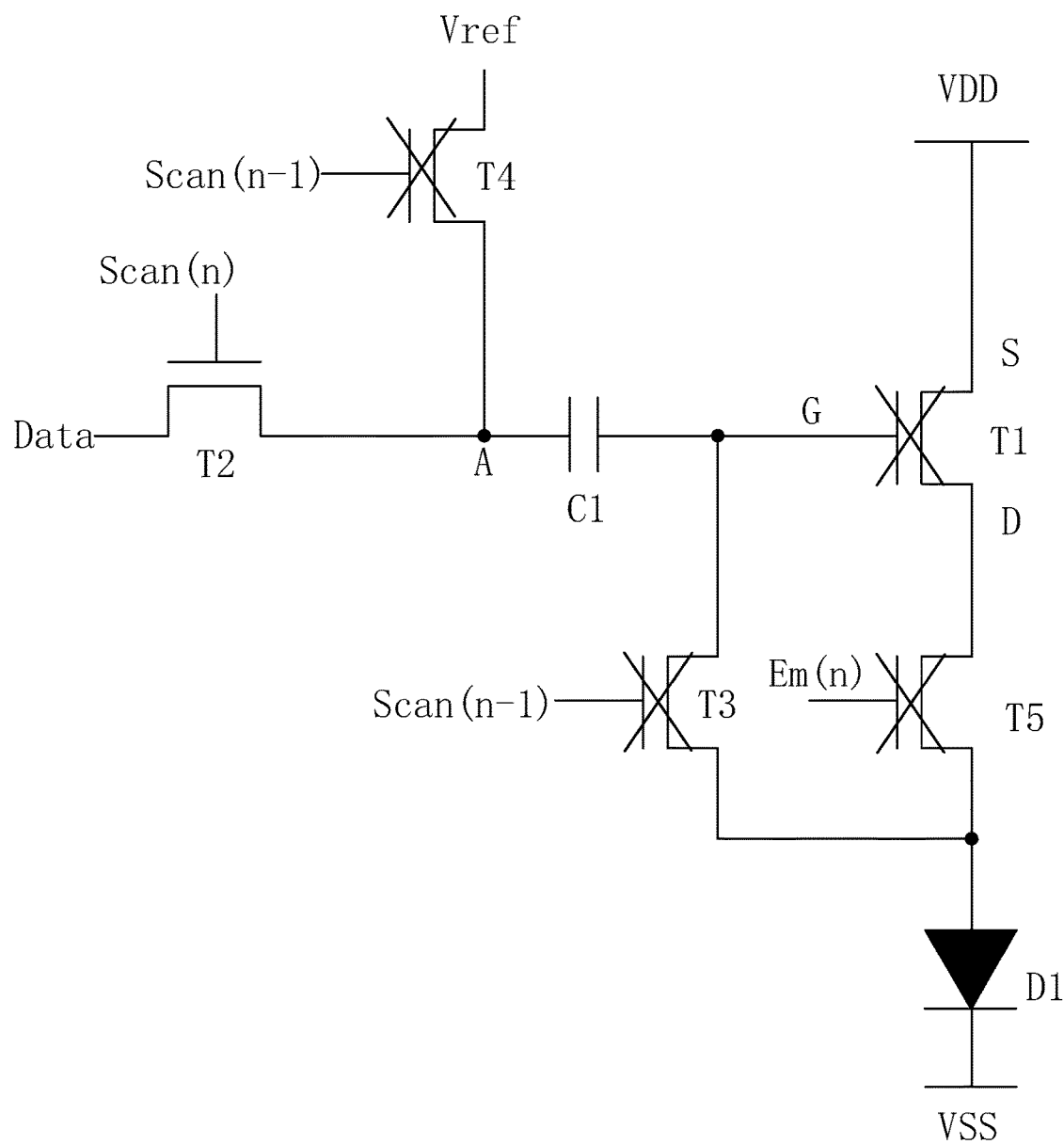
FIG. 10 is a diagram of the step 3 of an AMOLED pixel driving method according to the second embodiment of the present invention.

Specifically, for the first embodiment of the present invention, all of the first thin film transistor T1, the second thin film transistor T2, the third thin film transistor T3, the fourth thin film transistor T4 and the fifth thin film transistor T5 are P type third thin film transistors, and the effective potential is low voltage level, and the non effective potential is high voltage level; and for the second embodiment of the present invention, all of the first thin film transistor T1, the second thin film transistor T2, the third thin film transistor T3, the fourth thin film transistor T4 and the fifth thin film transistor T5 are N type third thin film transistors, and the effective potential is high voltage level, and the non effective potential is low voltage level.

step 3, entering a program stage;

As shown in FIG. 3 and FIG. 5, or in FIG. 8 and FIG. 10, the nth scan signal Scan(n) provides the effective potential to activate the second thin film transistor T2, and both the n-1th scan signal Scan(n-1) and the light emitting control signal Em(n) provide non effective potentials to deactivate the third thin film transistor T3, the fourth thin film transistor T4 and the fifth thin film transistor T5; the first node A is written with a voltage $V_{Data}$ of the data signal Data, and with the capacitor C1, the voltage level Vg of the gate G of the first thin film transistor T1 is coupled to:

$$Vg=V_{DATA}-Vref+VSS+V_{OLED} \quad (2)$$

Figure 6:
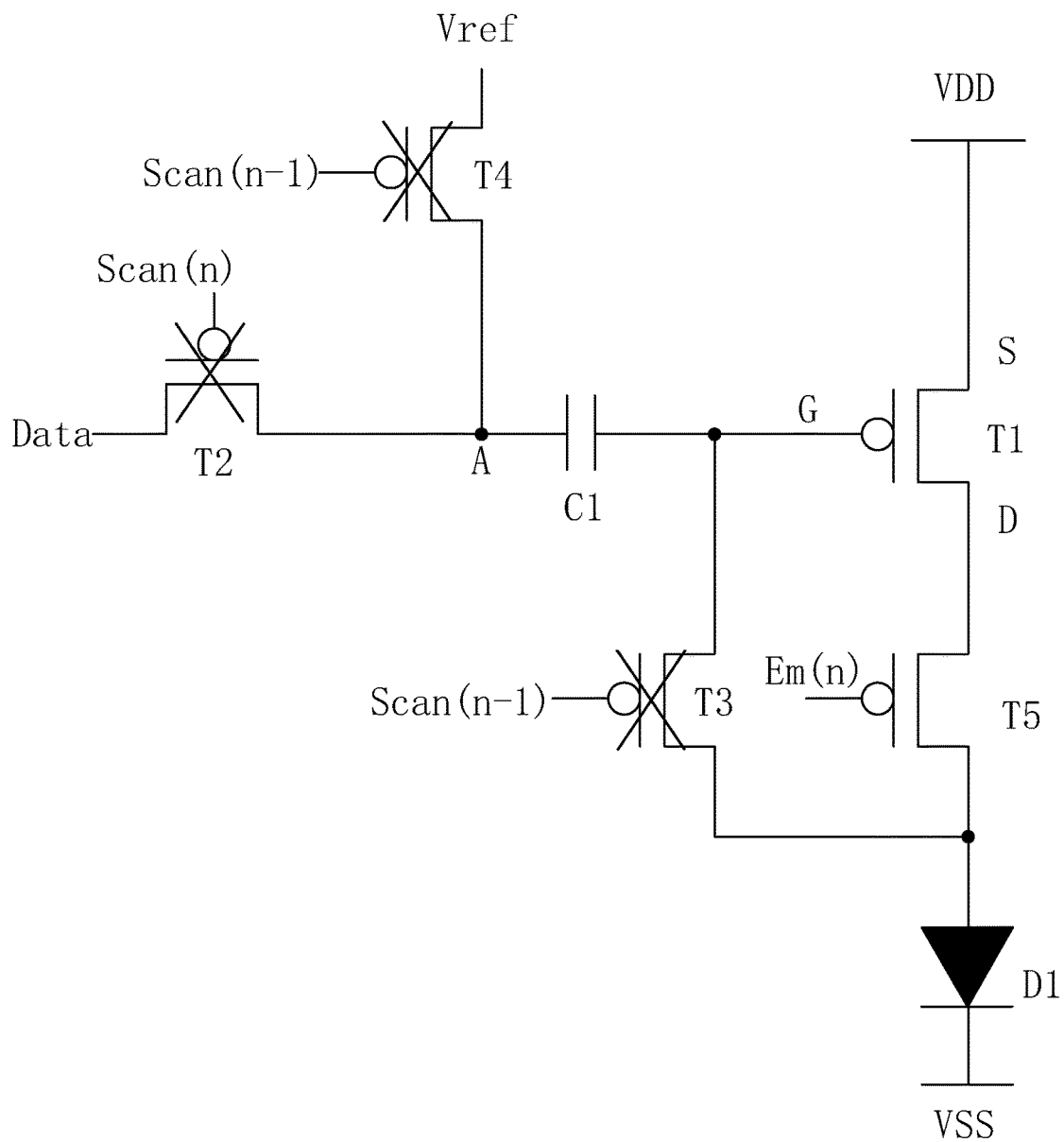
FIG. 6 is a diagram of the step 4 of an AMOLED pixel driving method according to the first embodiment of the present invention.
Figure 11:
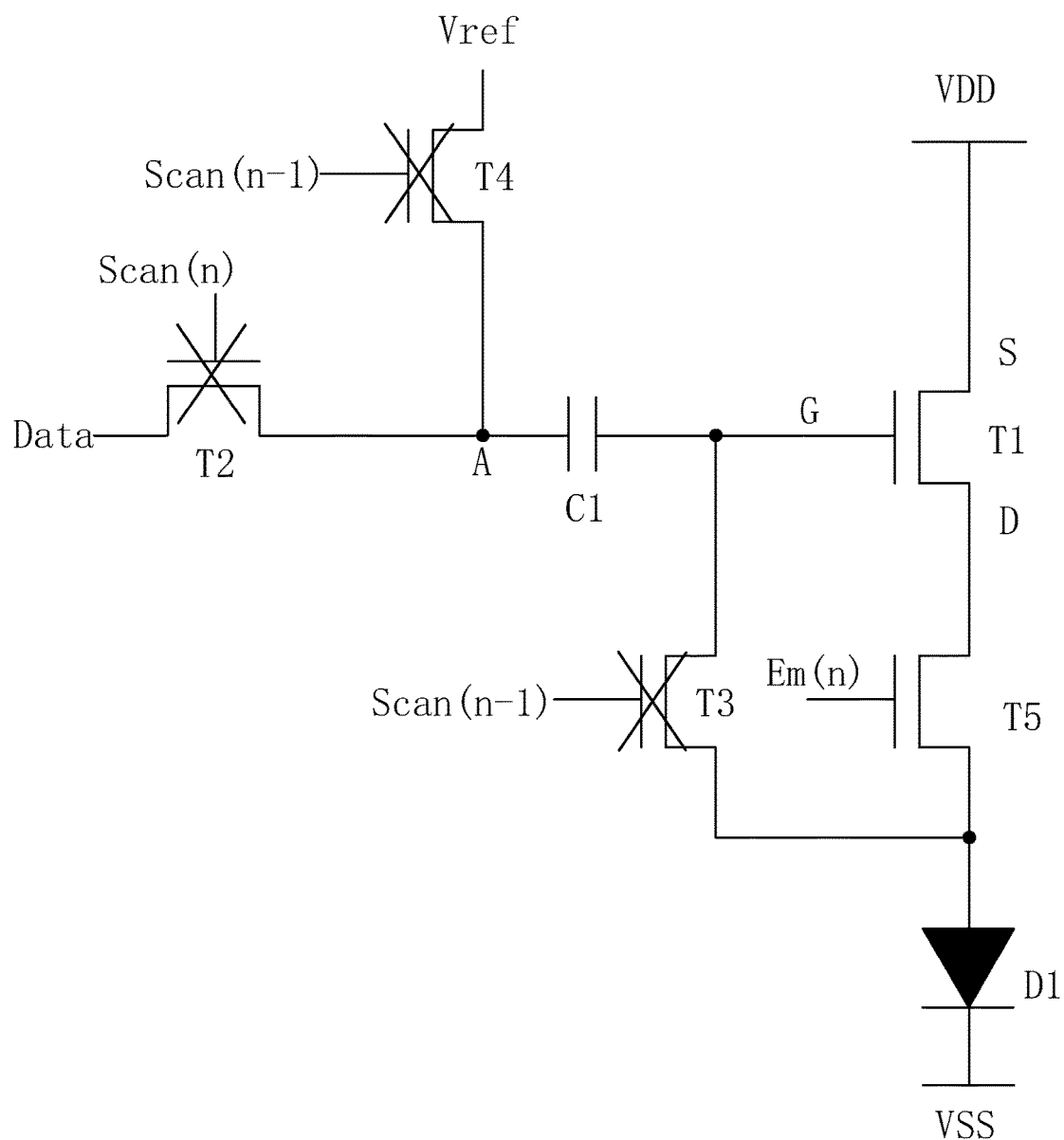
FIG. 11 is a diagram of the step 4 of an AMOLED pixel driving method according to the second embodiment of the present invention.

Similarly, for the first embodiment of the present invention, the effective potential is low voltage level, and the non effective potential is high voltage level; and for the second embodiment of the present invention, the effective potential is high voltage level, and the non effective potential is low voltage level.

step 4, entering a light emitting stage;

As shown in FIG. 3 and FIG. 6, or in FIG. 8 and FIG. 11, both the n-1th scan signal Scan(n-1) and the nth scan signal Scan(n) provide non effective potentials to deactivate the second thin film transistor T2, the third thin film transistor T3 and the fourth thin film transistor T4, and the light emitting control signal Em(n) provides the effective potential to activate the fifth thin film transistor T5, and the first thin film transistor T1 is also activated due to the storage function of the capacitor C1, and the organic light emitting diode D1 emits light, and a current $I_{OLED}$ flowing through the organic light emitting diode D1 satisfies:

$$I_{OLED} \propto (V_{DATA}-Vref+VSS+V_{OLED}-VDD-V_{th1})^2 \quad (5)$$

VDD represents a power source positive voltage, and $V_{th1}$ represents a threshold voltage of the first thin film transistor T1.

Similarly, for the first embodiment of the present invention, the effective potential is low voltage level, and the non effective potential is high voltage level; and for the second embodiment of the present invention, the effective potential is high voltage level, and the non effective potential is low voltage level.

The activation voltage $V_{OLED}$ raises due to the degradation after longterm work of the organic light emitting diode D1, and according to the equation (5), the AMOLED pixel driving method of the present invention can make the $I_{OLED}$ increase along with the rising of the $V_{OLED}$, which can qualitatively compensate the brightness decay of the organic light emitting diode D1 to raise the display quality of the OLED display device, and can compensate the light emitting efficiency reduction and the brightness decay condition after longterm work of the organic light emitting diode to raise the display quality of the OLED display device.

In conclusion, the AMOLED pixel driving circuit and the pixel driving method of the present invention utilize a 5T1C structure driving circuit, and the nth scan signal, the n-1th scan signal and the light emitting control signal are combined with one another, and correspond to an OLED activation voltage extracting stage, a program stage and a light emitting stage one after another. Ultimately, the current $I_{OLED}$ flowing through the organic light emitting diode satisfies: $I_{OLED} \propto (V_{DATA}-Vref+VSS+V_{OLED}-VDD-V_{th1})^2$. The activation voltage $V_{OLED}$ raises due to the degradation after longterm work of the organic light emitting diode, and the $I_{OLED}$ which increases accordingly can qualitatively compensate the brightness decay of the organic light emitting diode, which can compensate the light emitting efficiency reduction and the brightness decay condition after longterm work of the organic light emitting diode to raise the display quality of the OLED display device.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An AMOLED pixel driving circuit comprises: a first thin film transistor, a second thin film transistor, a third thin film transistor, a fourth thin film transistor, a fifth thin film transistor, a capacitor and an organic light emitting diode;

a gate of the second thin film transistor receives a nth scan signal corresponded with a row where the pixel driving circuit is, and a source receives a data signal, and a drain is electrically coupled to a first node;

a gate of the fourth thin film transistor receives a n-1th scan signal corresponded with a previous row of the row where the pixel driving circuit is, and a source receives a reference voltage, and a drain is electrically coupled to the first node;

one end of the capacitor is electrically coupled to the first node, and the other end is electrically coupled to a gate of the first thin film transistor;

a gate of the third thin film transistor receives the n-1th scan signal, and a source is electrically coupled to the gate of the first thin film transistor, and a drain is electrically coupled to an anode of the organic light emitting diode;

the gate of the first thin film transistor is electrically coupled to the other end of the capacitor, and a source receives a power source positive voltage, and a drain is electrically coupled to a source of the fifth thin film transistor;

a gate of the fifth thin film transistor receives a light emitting control signal, and a source is electrically coupled to the drain of the first thin film transistor, and a drain is electrically coupled to the anode of the organic light emitting diode;

the anode of the organic light emitting diode is electrically coupled to the drain of the fifth thin film transistor and the drain of the third thin film transistor, and a cathode receives a power source negative voltage.

2. The AMOLED pixel driving circuit according to claim 1, wherein all of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

3. The AMOLED pixel driving circuit according to claim 1, wherein the reference voltage is a constant voltage.

4. The AMOLED pixel driving circuit according to claim 1, wherein the nth scan signal corresponded with the row where the pixel driving circuit is, the n-1th scan signal corresponded with a previous row of the row where the pixel driving circuit is and the light emitting control signal are combined with one another, and correspond to an OLED activation voltage extracting stage, a program stage and a light emitting stage one after another.

5. The AMOLED pixel driving circuit according to claim 4, wherein all of the first thin film transistor, the second thin film transistor, the third thin film transistor, the fourth thin film transistor and the fifth thin film transistor are P type third thin film transistors;
   in the OLED activation voltage extracting stage, the n-1th scan signal is low voltage level, and the nth scan signal is high voltage level, and the light emitting control signal is high voltage level;
   in the program stage, the n-1th scan signal is high voltage level, and the nth scan signal is low voltage level, and the light emitting control signal is high voltage level;
   in the light emitting stage, the n-1th scan signal is high voltage level, and the nth scan signal is high voltage level, and the light emitting control signal is low voltage level.

6. The AMOLED pixel driving circuit according to claim 4, wherein all of the first thin film transistor, the second thin film transistor, the third thin film transistor, the fourth thin film transistor and the fifth thin film transistor are N type third thin film transistors;
   in the OLED activation voltage extracting stage, the n-1th scan signal is high voltage level, and the nth scan signal is low voltage level, and the light emitting control signal is low voltage level;
   in the program stage, the n-1th scan signal is high voltage level, and the nth scan signal is high voltage level, and the light emitting control signal is low voltage level;
   in the light emitting stage, the n-1th scan signal is low voltage level, and the nth scan signal is low voltage level, and the light emitting control signal is high voltage level.

7. An AMOLED pixel driving method, comprising steps of:
   step 1, providing an AMOLED pixel driving circuit;
   the AMOLED pixel driving circuit comprises: a first thin film transistor, a second thin film transistor, a third thin film transistor, a fourth thin film transistor, a fifth thin film transistor, a capacitor and an organic light emitting diode;
   a gate of the second thin film transistor receives a nth scan signal corresponded with a row where the pixel driving circuit is, and a source receives a data signal, and a drain is electrically coupled to a first node;
   a gate of the fourth thin film transistor receives a n-1th scan signal corresponded with a previous row of the row where the pixel driving circuit is, and a source receives a reference voltage, and a drain is electrically coupled to the first node;
   one end of the capacitor is electrically coupled to the first node, and the other end is electrically coupled to a gate of the first thin film transistor;
   a gate of the third thin film transistor receives the n-1th scan signal, and a source is electrically coupled to the gate of the first thin film transistor, and a drain is electrically coupled to an anode of the organic light emitting diode;
   the gate of the first thin film transistor is electrically coupled to the other end of the capacitor, and a source receives a power source positive voltage, and a drain is electrically coupled to a source of the fifth thin film transistor;
   a gate of the fifth thin film transistor receives a light emitting control signal, and a source is electrically coupled to the drain of the first thin film transistor, and a drain is electrically coupled to the anode of the organic light emitting diode;
   the anode of the organic light emitting diode is electrically coupled to the drain of the fifth thin film transistor and the drain of the third thin film transistor, and a cathode receives a power source negative voltage;
   step 2, entering an OLED activation voltage extracting stage;
   the n-1th scan signal provides a effective potential to activate the fourth thin film transistor and the third thin film transistor, and both the nth scan signal and the light emitting control signal provide non effective potentials to deactivate the second thin film transistor and the fifth thin film transistor; the first node is written with the reference voltage, and a voltage level Vg of the gate of the first thin film transistor is discharged to:

$$Vg=VSS+V_{OLED}$$

VSS represents a power source negative voltage, and $V_{OLED}$ represent an activation voltage of the organic light emitting diode;
   step 3, entering a program stage;
   the nth scan signal provides the effective potential to activate the second thin film transistor, and both the n-1th scan signal and the light emitting control signal provide non effective potentials to deactivate the third thin film transistor, the fourth thin film transistor and the fifth thin film transistor; the first node is written with a voltage $V_{Data}$ of the data signal, and with the capacitor, the voltage level Vg of the gate of the first thin film transistor is coupled to:

$$Vg=V_{DATA}-Vref+VSS+V_{OLED}$$

step 4, entering a light emitting stage;
   both the n-1th scan signal and the nth scan signal provide non effective potentials to deactivate the second thin film transistor, the third thin film transistor and the fourth thin film transistor, and the light emitting control signal provides the effective potential to activate the fifth thin film transistor, and the first thin film transistor is also activated, and the organic light emitting diode emits light, and a current $I_{OLED}$ flowing through the organic light emitting diode satisfies:

$$I_{OLED} \propto (V_{DATA}-Vref+V_{OLED}-VDD-V_{th1})^2$$

VDD represents a power source positive voltage, and $V_{th1}$ represents a threshold voltage of the first thin film transistor.

8. The AMOLED pixel driving method according to claim 7, wherein all of the first thin film transistor, the second thin film transistor, the third thin film transistor, the fourth thin film transistor and the fifth thin film transistor are P type thin film transistors; the effective potential is low voltage level, and the non effective potential is high voltage level.

9. The AMOLED pixel driving method according to claim 7, wherein all of the first thin film transistor, the second thin film transistor, the third thin film transistor, the fourth thin film transistor and the fifth thin film transistor are N type thin film transistors; the effective potential is high voltage level, and the non effective potential is low voltage level.

10. The AMOLED pixel driving method according to claim 7, wherein the reference voltage is a constant voltage.

11. An AMOLED pixel driving circuit, comprising: a first thin film transistor, a second thin film transistor, a third thin film transistor, a fourth thin film transistor, a fifth thin film transistor, a capacitor and an organic light emitting diode;
a gate of the second thin film transistor receives a nth scan signal corresponded with a row where the pixel driving circuit is, and a source receives a data signal, and a drain is electrically coupled to a first node;
a gate of the fourth thin film transistor receives a n-1th scan signal corresponded with a previous row of the row where the pixel driving circuit is, and a source receives a reference voltage, and a drain is electrically coupled to the first node;
one end of the capacitor is electrically coupled to the first node, and the other end is electrically coupled to a gate of the first thin film transistor;
a gate of the third thin film transistor receives the n-1th scan signal, and a source is electrically coupled to the gate of the first thin film transistor, and a drain is electrically coupled to an anode of the organic light emitting diode;
the gate of the first thin film transistor is electrically coupled to the other end of the capacitor, and a source receives a power source positive voltage, and a drain is electrically coupled to a source of the fifth thin film transistor;
a gate of the fifth thin film transistor receives a light emitting control signal, and a source is electrically coupled to the drain of the first thin film transistor, and a drain is electrically coupled to the anode of the organic light emitting diode;
the anode of the organic light emitting diode is electrically coupled to the drain of the fifth thin film transistor and the drain of the third thin film transistor, and a cathode receives a power source negative voltage;
wherein all of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors;
wherein the reference voltage is a constant voltage.

12. The AMOLED pixel driving circuit according to claim 11, wherein the nth scan signal corresponded with the row where the pixel driving circuit is, the n-1th scan signal corresponded with a previous row of the row where the pixel driving circuit is and the light emitting control signal are combined with one another, and correspond to an OLED activation voltage extracting stage, a program stage and a light emitting stage one after another.

13. The AMOLED pixel driving circuit according to claim 12, wherein all of the first thin film transistor, the second thin film transistor, the third thin film transistor, the fourth thin film transistor and the fifth thin film transistor are P type third thin film transistors;
in the OLED activation voltage extracting stage, the n-1th scan signal is low voltage level, and the nth scan signal is high voltage level, and the light emitting control signal is high voltage level;
in the program stage, the n-1th scan signal is high voltage level, and the nth scan signal is low voltage level, and the light emitting control signal is high voltage level;
in the light emitting stage, the n-1th scan signal is high voltage level, and the nth scan signal is high voltage level, and the light emitting control signal is low voltage level.

14. The AMOLED pixel driving circuit according to claim 12, wherein all of the first thin film transistor, the second thin film transistor, the third thin film transistor, the fourth thin film transistor and the fifth thin film transistor are N type third thin film transistors;
in the OLED activation voltage extracting stage, the n-1th scan signal is high voltage level, and the nth scan signal is low voltage level, and the light emitting control signal is low voltage level;
in the program stage, the n-1th scan signal is high voltage level, and the nth scan signal is high voltage level, and the light emitting control signal is low voltage level;
in the light emitting stage, the n-1th scan signal is low voltage level, and the nth scan signal is low voltage level, and the light emitting control signal is high voltage level.

* * * * *